United States Patent [19]

Keys

[11] Patent Number: 5,061,024

[45] Date of Patent: Oct. 29, 1991

[54] AMORPHOUS FLUOROPOLYMER PELLICLE FILMS

[75] Inventor: Dalen E. Keys, Towanda, Pa.

[73] Assignee: E. I. Du Pont de Nemours and Company, Wilmington, Del.

[21] Appl. No.: 403,644

[22] Filed: Sep. 6, 1989

[51] Int. Cl.⁵ .................................................. G02B 1/04
[52] U.S. Cl. ..................................... 359/350; 359/507; 359/892
[58] Field of Search .......................... 350/1.1, 318, 582

[56] References Cited

U.S. PATENT DOCUMENTS

| | | | |
|---|---|---|---|
| 4,131,363 | 12/1978 | Shea et al. | 355/75 |
| 4,378,953 | 4/1983 | Winn | 350/171 |
| 4,465,759 | 8/1984 | Duly et al. | 430/321 |
| 4,476,172 | 10/1984 | Ward | 428/38 |
| 4,482,591 | 11/1984 | Ward | 428/66 |
| 4,499,231 | 2/1985 | Ward et al. | 524/506 |
| 4,523,974 | 6/1985 | Duly et al. | 156/630 |
| 4,536,240 | 8/1985 | Winn | 156/74 |
| 4,754,009 | 6/1988 | Squire | 526/247 |
| 4,754,099 | 6/1988 | Kemp et al. | 585/646 |
| 4,796,973 | 1/1989 | Gordon | 350/1.1 |
| 4,935,477 | 6/1990 | Squire | 526/247 |

FOREIGN PATENT DOCUMENTS

| | | |
|---|---|---|
| 58-219023 | 12/1983 | Japan . |
| 60-083032 | 5/1985 | Japan . |
| 60-237450 | 11/1985 | Japan . |

*Primary Examiner*—Bruce Y. Arnold
*Assistant Examiner*—David R. Parsons

[57] ABSTRACT

A pellicle comprising a thin, durable film of substantially uniform thickness which absorbs less than 10% light at wavelengths between 190 and 820 nanometers, tautly adhered to one edge of an enclosed support frame, said thin film comprising amorphous fluoropolymers having a refractive index between 1.24 and 1.41. Pellicles of this type are dust defocusing covers for photomasks and reticles used to project patterns onto light sensitive substrates such as photoresist-coated semiconductor wafers which are used in the manufacture of integrated circuits.

7 Claims, 4 Drawing Sheets

AMORPHOUS FLUOROPOLYMER PELLICLE FILMS

FIELD OF THE INVENTION

The invention relates to a pellicle which is used as a dust defocusing cover for a photomask or reticle. More specifically, the invention relates to a pellicle which transmits a high percentage of incident light, especially in the deep ultraviolet wavelength range.

BACKGROUND

Projection printing systems for forming an image on a light sensitive substrate or wafer are particularly suitable for effecting the exposure of photoresist-coated semiconductor wafers in the manufacture of integrated circuits. These systems normally include a photomask or reticle (hereinafter "mask") having a transparent substrate with a pattern of opaque and transparent areas formed on one surface thereof, an illumination system for directing a beam of radiant energy such as light or ultraviolet rays through the mask to the wafer, optical means for forming a focused image of the mask pattern on the wafer and a pellicle for maintaining the images of any dust particles out of focus on the surface of the mask.

The pellicle is a free-standing thin optical film mounted on a frame. Normally, the frame is attached to the mask and the optical film stands away from the mask surface by a given distance. Dust particles which might otherwise settle on the mask and be projected onto the wafer, will settle on the pellicle instead and be defocused. Consequently, when pellicles are used in a conventional projection printing system, one or more dust particles will not affect the yield of a given wafer and yields can be significantly improved.

Ideally, pellicles should be invisible to the radiant energy of the projection printing system. That is, in order to produce clear, well-defined patterns, the optical film of the pellicle should transmit 100% (i.e. reflect 0%) of the radiant energy used during the projection printing process.

In the past, pellicle films have typically been made of nitrocellulose. With increasing miniaturization, the pattern elements have become smaller and smaller and the optical transmission of the pellicle films, especially over a broad range of energy wavelengths, has become increasingly insufficient. Accordingly, different materials have been proposed for pellicle films.

In U.S. Pat. No. 4,131,363, Shea et al. discloses polyoxyethylene terephthalate and parylene as suitable materials for pellicle films. In U.S. Pat. Nos. 4,378,953 and 4,536,240, Winn teaches acrylics as pellicle films. And Japanese patent publication Kokai Patent No. 58-219023 discloses pellicle films made of cellulose esters.

Ward uses the reaction product of a polyvinyl butyral resin and a silane as a pellicle film in U.S. Pat. No. 4,476,172. And in U.S. Pat. No. 4,482,591 to Ward and U.S. Pat. No. 4,499,231 to Ward et al., a composition comprising a mixture of a polyvinyl butyral resin and a dispersion of colloidal silica and a silicone resin is disclosed as a suitable material for a pellicle film.

Japanese patent publication Kokai Patent No. 60-083032 discloses a fluorine polymer of refractive index below 1.42 in a pellicle film.

U.S. Pat. Nos. 4,465,759 and 4,523,974 disclose a polymethylmethacrylate pellicle film. And U.S. Pat. No. 4,796,973 to Gordon discloses cellulose acetate butyrate pellicle films.

Although these various materials form pellicle films which transmit a substantial portion of incident radiant energy, there is still room for improvement. For example, many of the materials deteriorate rapidly upon exposure to deep ultraviolet radiant energy and some transmit a high percentage of incident energy only within a narrow range of energy wavelengths. Thus, there is still a need in the art for a pellicle film which transmits a high percentage of incident light and is useful and durable over a broader wavelength of incident radiant energy.

SUMMARY OF THE INVENTION

The invention is directed to a pellicle comprising a thin, durable film of substantially uniform thickness which absorbs less than 10% light at wavelengths between 190 and 820 nanometers and has less than 1% reduction in average transmission from 200 to 300 nanometers after 500 Joules/cm$^2$ of total exposure using 248 nanometer wavelength light, tautly adhered to one edge of an enclosed support frame, said thin film comprising amorphous fluoropolymers having a refractive index between 1.24 and 1.41.

More particularly, the invention is directed to a pellicle comprising a thin, durable film of substantially uniform thickness which absorbs less than 10% light at wavelengths between 190 and 820 nanometers, tautly adhered to one edge of an enclosed support frame, said thin film comprising amorphous fluoropolymers consisting of copolymers of 30–99 mole % of perfluoro-2,2-dimethyl-1,3-dioxole (PDD) with complementary amounts of at least one comonomer selected from the class consisting of the following compounds:

a) tetrafluoroethylene,
b) chlorotrifluoroethylene,
c) vinylidene fluoride,
d) hexafluoropropylene,
e) trifluoroethylene,
f) perfluoro(alkyl vinyl ethers) of the formula $CF_2=CFOR_F$, where $R_F$ is a normal perfluoroalkyl radical having 1–3 carbon atoms,
g) fluorovinyl ethers of the formula $CF_2=CFOQZ$, where Q is a perfluorinated alkylene radical containing 0–5 ether oxygen atoms, wherein the sum of the C and O atoms in Q is 2 to 10; and Z is a group selected from the class consisting of —COOR, —SO$_2$F, —CN, —COF, and —OCH$_3$, where R is a $C_1$–$C_4$ alkyl,
h) vinyl fluoride, and
i) (perfluoroalkyl)ethylene, $R_f CH=CH_2$, where $R_f$ is a $C_1$–$C_8$ normal perfluoroalkyl radical;

the glass transition temperature of the copolymer being at least 80° C., the maximum mole percentage, $M_a \ldots M_i$, of the comonomer in the copolymers being as follows:

a) for tetrafluoroethylene, $M_a=70$,
b) for chlorotrifluoroethylene, $M_b=70$,
c) for vinylidene fluoride, $M_c=70$,
d) for hexafluoropropylene, $M_d=15$,
e) for trifluoroethylene, $M_e=30$,
f) for $CF_2=CFOR_F$, $M_f=30$,
g) for $CF_2=CFOQZ$, $M_g=20$,
h) for vinyl fluoride, $M_h=70$, and
i) for $R_f CH=CH_2$, $M_i=10$;

and, in the case of copolymers with more than one comonomer, the amount of each comonomer being such that the sum, S, of the ratios of the mole percentages, $m_a \ldots m_i$, to the corresponding maximum mole percentages, $M_a \ldots M_i$ is no larger than 1, as shown below:

$$S = m_a/M_a + m_b/M_b + \ldots + m_i/M_i \leq 1.$$

As used herein, the term "complementary" means that the mole percentage of PDD plus the mole percentages of all the above comonomers (a) through (i) present in the copolymer add together to 100%.

DETAILED DESCRIPTION OF THE INVENTION

Pellicle Film

Figure 1:
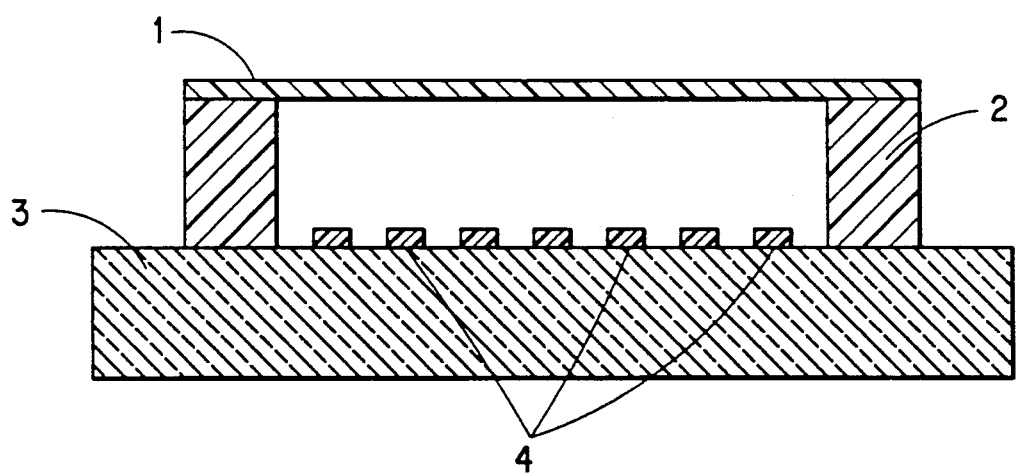
FIG. 1 is a cross-sectional view of a photomask which has a pattern coated thereon and a pellicle secured thereto.

Any fluoropolymer having a refractive index between 1.24 and 1.41 that is capable of forming a free standing thin, durable film of substantially uniform thickness which absorbs less than 10%, preferably less than 6%, more preferably less than 3% and most preferably less than 1%, incident radiant energy at wavelengths between 190 and 820 nanometers may be used to form the pellicle film. The thickness of a film of this type is considered substantially uniform if the thickness varies by less than 2 wavelengths of exposure frequency per inch. Typically, these pellicle films have a thickness of 0.3 to 20 microns. Preferably, the pellicle film has a thickness of 0.8 to 3.0 microns. As used herein, the term "durable" means the film achieves less than 1% reduction in average transmission from 200-300 nanometers after 500 Joules/cm² of total exposure using 248 nanometer wavelength light.

A fluoropolymer having a refractive index of 1.29 to 1.32 is preferred. Particularly preferred fluoropolymers are the amorphous copolymers of PDD with complementary amounts of at least one comonomer selected from the class consisting of the following compounds:

a) tetrafluoroethylene,
b) chlorotrifluoroethylene,
c) vinylidene fluoride,
d) hexafluoropropylene,
e) trifluoroethylene,
f) perfluoro(alkyl vinyl ethers) of the formula $CF_2=CFOR_F$, where $R_F$ is a normal perfluoroalkyl radical having 1-3 carbon atoms,
g) fluorovinyl ethers of the formula $CF_2=CFOQZ$, where Q is a perfluorinated alkylene radical containing 0-5 ether oxygen atoms, wherein the sum of the C and O atoms in Q is 2 to 10; and Z is a group selected from the class consisting of $-COOR$, $-SO_2F$, $-CN$, $-COF$, and $-OCH_3$, where R is a $C_1$-$C_4$ alkyl,
h) vinyl fluoride, and
i) (perfluoroalkyl)ethylene, $R_fCH=CH_2$, where $R_f$ is a $C_1$-$C_8$ normal perfluoroalkyl radical;

the glass transition temperature of the copolymer being at least 80° C., the maximum mole percentage, $M_a \ldots M_i$, of the comonomer in the copolymers being as follows:

a) for tetrafluoroethylene, $M_a = 70$,
b) for chlorotrifluoroethylene, $M_b = 70$,
c) for vinylidene fluoride, $M_c = 70$,
d) for hexafluoropropylene, $M_d = 15$,
e) for trifluoroethylene, $M_e = 30$,
f) for $CF_2=CFOR_F$, $M_f = 30$,
g) for $CF_2=CFOQZ$, $M_g = 20$,
h) for vinyl fluoride, $M_h = 70$, and
i) for $R_fCH=CH_2$, $M_i = 10$;

and, in the case of copolymers with more than one comonomer, the amount of each comonomer being such that the sum, S, of the ratios of the mole percentages, $m_a \ldots m_i$, to the corresponding maximum mole percentages, $M_a \ldots M_i$ is no larger than 1, as shown below:

$$S = m_a/M_a + m_b/M_b + \ldots + m_i/M_i \leq 1.$$

These copolymers are disclosed in the U.S. Pat. Nos. 4,754,099 and 4,935,477 and copending U.S. patent application Ser. No. 07/148,579, now abandoned each of which is incorporated herein by reference.

PDD is copolymerized with any one or more of the above-mentioned monomers to produce an amorphous copolymer. All of the principal monomers used in this invention are known in the art. Copolymerization is carried out in the presence of a free radical generator at a temperature suitable for the initiator chosen. Well agitated pressure equipment and a nontelogenic solvent or diluent should be used, preferably one that has sufficient volatility to permit easy removal from the polymer.

These amorphous copolymers of PDD possess properties which are especially desirable for a pellicle film. Such properties include low absorption and dispersion of light in a broad range of wavelengths, low water absorption to reduce sagging, greater durability to permit repeated exposure, low refractive indices, low surface energy to reduce particulate adhesion and good chemical resistance to solvents and cleaning agents. In addition, these amorphous copolymers of PDD can be applied from a solvent which evaporates after application to produce a uniform anti-reflective layer. The solution of the PDD copolymers in solvent is filterable to reduce the size and number of particles within the resultant pellicle film. Particles within the film can interfere with the transmission of incident radiant energy in the same way as particles on a pellicle film. Preferably, the solution is filtered such that the final film contains less than 20 visible particles and no particles greater than 20 microns. Suitable solvents include fluorocarbons such as Fluorinert ® FC-40 Electronic Liquid, perfluoro trialkyl amines, Fluorinert ® FC-75 Electronic Liquid, perfluoro(2-butyltetrahydrofuran) and Fluorinert ® FC-77 Electronic Liquid, a fully fluorinated organic compound with a typical molecular weight range of 300-1000.

A more preferred pellicle film of the invention comprises an amorphous copolymer of 30-99 mole % PDD with a complementary amount of TFE and has an index of refraction in the range of 1.29 to 1.32. An amorphous copolymer of 60-90 mole % PDD and 40-10 mole % TFE is further preferred. One particularly preferred pellicle film comprises an amorphous copolymer of 65 mole % PDD with 35 mole % TFE. Another particularly preferred pellicle film comprises an amorphous copolymer of 90 mole % PDD with 10 mole % TFE.

To further enhance the transmissivity of the above described fluoropolymer pellicle film, a suitable antireflective layer or layers may be applied to the fluoropolymer film.

Support Frame

The closed support frame of the invention may be in any shape and size suitable for attachment to a photo mask or reticle such that the pellicle film does not touch and the frame does not interfere with the work surface of the mask or reticle. Typically, the support frame is circular with a diameter of 1-6 inches, or square with sides of 1-6 inches. The material of the support frame should have high strength, a low tendency to attract dust, and a light weight. Hard plastics, and metals such as aluminum, and aluminum alloys are suitable materials for the support frame. An aluminum alloy, particularly machined, anodized aluminum, is preferred.

The pellicle film is tautly adhered to the closed support frame. Conventional glues and adhesives may be used to adhere the film to the frame provided the glue or adhesive does not contain a solvent for the core layer. Alternatively, the film may be adhered to the frame by heat press lamination. Preferably, a liquid, UV curable (i.e., curable upon exposure to ultra-violet light) adhesive, such as Norland Optical Adhesive No. 81 (Norland Products, Inc., New Brunswick, N.J.), is used in this invention.

Pellicle

The manufacture of pellicles is known in the art. A thin film of the fluoropolymer of the invention is formed. This film is then tautly adhered to an edge of a closed support frame.

The films of the invention can be produced by methods known in the art, e.g. Japanese patent publication Kokai Patent No. 60-237450.

In a preferred method, the pellicle film is produced by dissolving a fluoropolymer of the invention in a solvent, filtering the solution and spin coating the solution onto a glass substrate. A solution suitable for spin coating should wet the substrate, form a uniform coating on the substrate and dry uniformly. After the solution is coated onto the spinning substrate, spinning is stopped and the coating is heated to evaporate solvent and form a uniform film. This uniform film is isolated from the substrate onto a lifting frame.

Subsequently, the film is appropriately adhered to a closed support frame by a suitable adhesive and extended tautly across the support frame, which is smaller than the lifting frame. The side of the support frame opposite the adhered film is secured to a mask surface, the pellicle film suspended above the pattern on the surface of the mask. FIG. 1 illustrates such a pellicized mask. The mask 3 is transparent and typically, composed of silica. A pattern 4 is coated on the upper surface of mask 3. This pattern is encompassed by support frame 2 and covered by pellicle film 1. Radiant energy is projected from a source above the pellicle film through the film, pattern and mask onto a photoresist coated wafer in order to produce integrated circuits.

Although the foregoing discussion and the following examples are directed primarily to single layer thin optical films, the invention is not so limited. The ordinary artisan will recognize that additional layers such as antistatic layers and cooperating antireflective layers, may also be part of the thin optical film of this invention. For example, a calcium fluoride anti-reflective layer may be coated on one or both sides of a PDD copolymer base film. In accordance with established principles of physics, the optimal thickness of the antireflective layer will vary depending on the refractive index of the antireflective layer material and the wavelength of energy that will be used. For example, a single transparent layer will reduce surface reflection if the refractive index of the layer is less than that of the substrate to which it is applied and the layer is of appropriate thickness. If the index of refraction of the layer material is exactly equal to the square root of that of the substrate, all surface reflection of light will be eliminated for that wavelength at which the product of refractive index times thickness is equal to one-quarter of the wavelength. At other wavelengths, the destructive interference between light reflected from top and bottom surfaces of the antireflection layer is not complete; but, nonetheless, there is a reduction in overall reflectiveness. Conventional methods such as spin-coating may be used to produce these films having additional layers.

EXAMPLES

Figure 2:
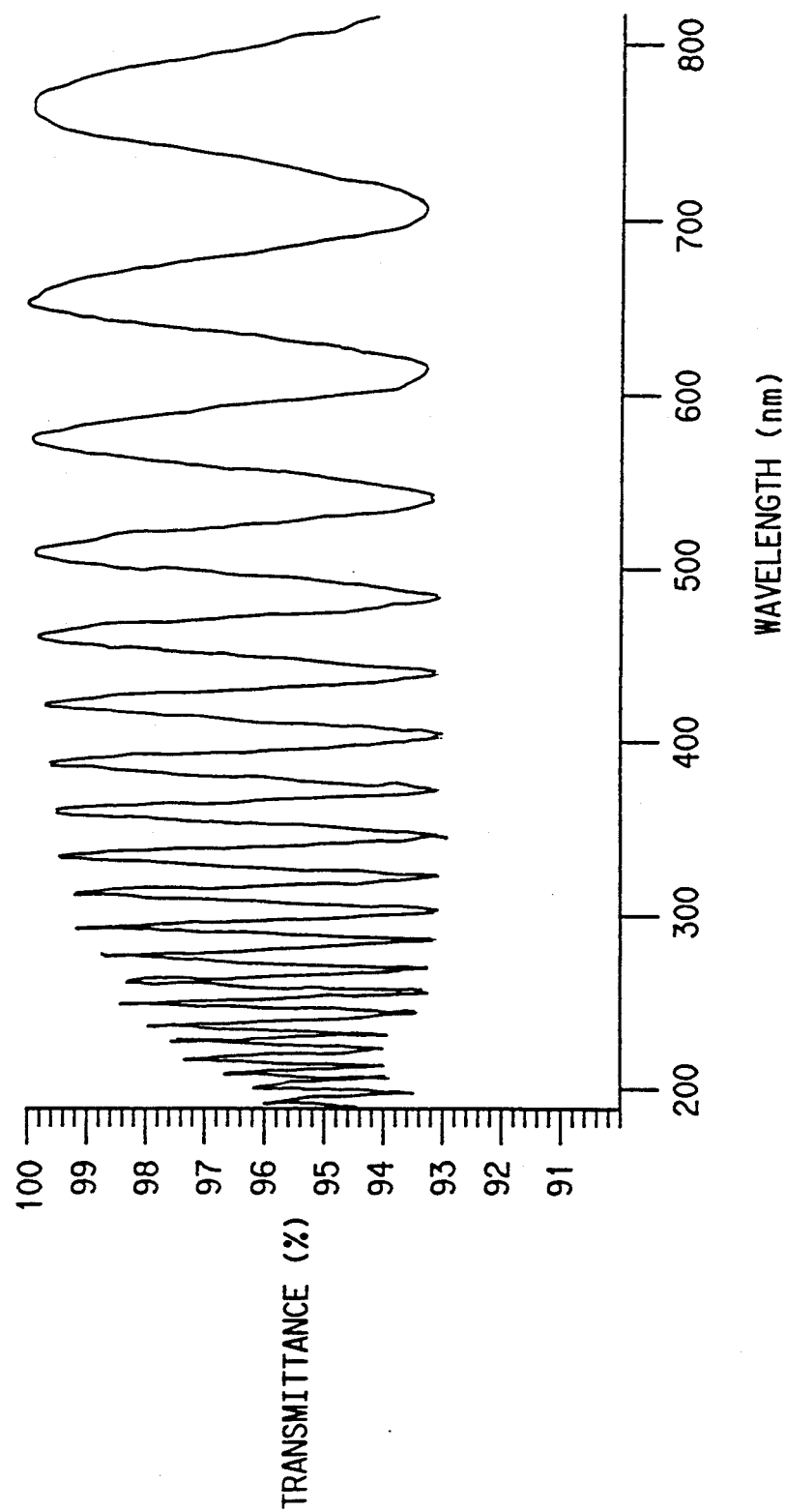
FIG. 2 is a graph of the percentage of light transmitted versus the wavelength of light, measured in nanometers, for the 1.78 micron thick, fluoropolymer film of Example 1.
Figure 3:
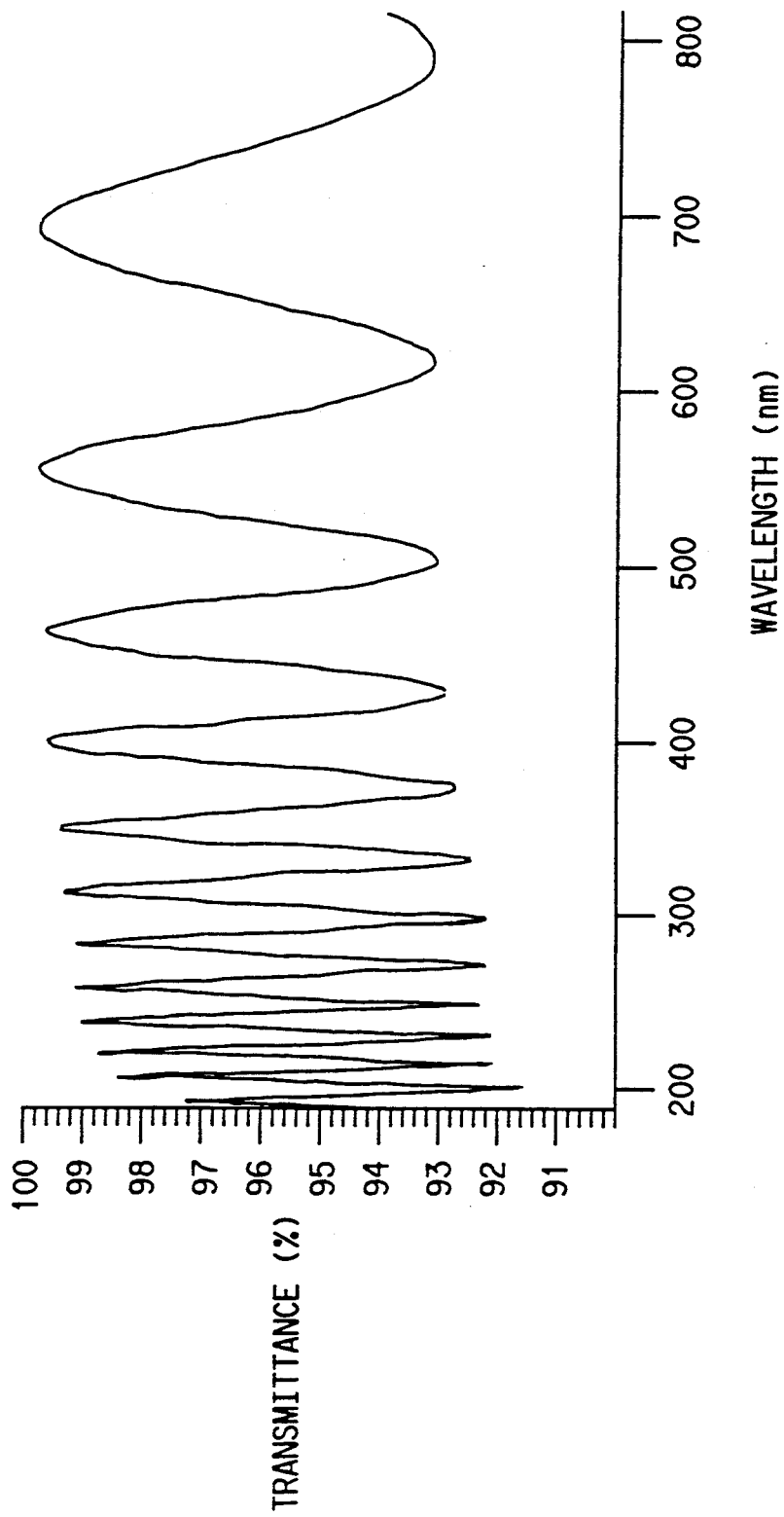
FIG. 3 is a graph of the percentage of light transmitted versus the wavelength of light, measured in nanometers, for the 1.0 micron thick, fluoropolymer film of Example 2.
Figure 4:
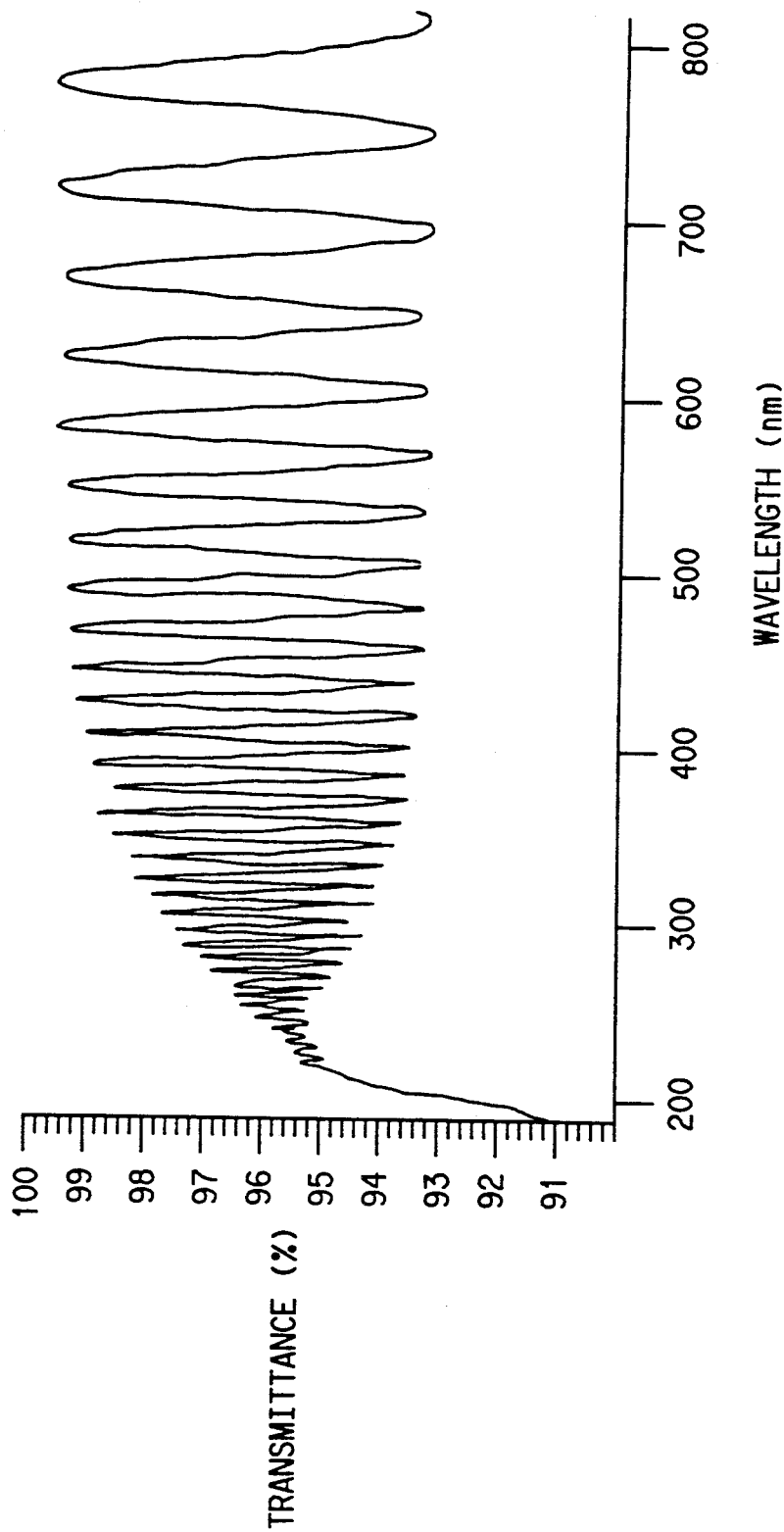
FIG. 4 is a graph of the percentage of light transmitted versus the wavelength of light, measured in nanometers, for the 3.6 micron thick, fluoropolymer film of Example 3.

In the following examples, the preferred method for making a pellicle film which was described above was used with the indicated materials and conditions. FIGS. 2-4 are spectral transmission graphs for the respective examples. The horizontal axis of each graph is wavelength, in nanometers, of a standard high pressure mercury lamp and the vertical axis is the percentage of light transmitted through the respective pellicle film.

EXAMPLE 1

A solution of 6.5% by weight of a 65 mole % PDD with 35 mole % TFE copolymer ($T_g$=148.4° C.) dissolved in Fluorinert® FC-40 Electronic Liquid, perfluoro trialkyl amines, was filtered through a 10 micron filter and dispensed onto a glass substrate. The glass substrate which rotated for 2 minutes with a final rotation rate of 1500 rpm. The coated substrate was heated to 170° C. for 10 minutes to evaporate solvent from the PDD/TFE copolymer layer. The resulting uniform, 1.78 micron thick film transmitted greater than 92% of incident light at wavelengths of 193 to 820 nanometers, as shown in FIG. 2.

EXAMPLE 2

Example 1 was repeated except that the PDD/TFE copolymer solution was spin coated onto a glass substrate which had a final rotation rate of 4000 rpm. The coated substrate was heated to 170° C. for 10 minutes to evaporate solvent from the PDD/TFE copolymer layer. The resulting uniform, 1.0 micron thick film transmitted greater than 91% of incident light at wavelengths of 193 to 820 nanometers, as shown in FIG. 3.

EXAMPLE 3

A solution of 8% by weight of a 68 mole % PDD with 32 mole % TFE copolymer ($T_g=154.6°$ C.) dissolved in Fluorinert ® FC-40 Electronic Liquid, perfluoro trialkyl amines, was filtered through a 10 micron filter and dispensed onto a glass substrate. The glass substrate which rotated with a final rotation rate of 1100 rpm. The coated substrate was heated to 100° C. for 10 minutes to evaporate solvent from the PDD/TFE copolymer layer. The resulting uniform, 3.6 micron thick film transmitted greater than 91% of incident light at wavelengths of 193 to 820 nanometers, as shown in FIG. 4.

LIST OF ABBREVIATIONS

TFE = tetrafluoroethylene
PDD = perfluoro-2,2-dimethyl-1,3-dioxole

LIST OF TRADEMARKS

FLUORINERT ® is a trademark of 3M Co., St. Paul, Minn.

We claim:

1. A pellicle comprising a thin, durable film of substantially uniform thickness which absorbs less than 10% light at wavelengths between 190 and 820 nanometers, tautly adhered to one edge of an enclosed support frame, said thin film comprising amorphous fluoropolymers having a refractive index between 1.24 and 1.41.

2. A pellicle according to claim 1, wherein said amorphous fluoropolymers are copolymers of 30-99 mole % of perfluoro-2,2-dimethyl-1,3-dioxole with complementary amounts of at least one comonomer selected from the class consisting of the following compounds:
   a) tetrafluoroethylene,
   b) chlorotrifluoroethylene,
   c) vinylidene fluoride,
   d) hexafluoropropylene,
   e) trifluoroethylene,
   f) perfluoro(alkyl vinyl ethers) of the formula $CF_2=CFOR_F$, where $R_F$ is a normal perfluoroalkyl radical having 1-3 carbon atoms,
   g) fluorovinyl ethers of the formula $CF_2=CFOQZ$, where Q is a perfluorinated alkylene radical containing 0-5 ether oxygen atoms, wherein the sum of the C and O atoms in Q is 2 to 10; and Z is a group selected from the class consisting of $-COOR$, $-SO_2F$, $-CN$, $-COF$, and $-OCH_3$, where R is a $C_1-C_4$ alkyl,
   h) vinyl fluoride, and
   i) (perfluoroalkyl)ethylene, $R_fCH=CH_2$, where $R_f$ is a $C_1-C_8$ normal perfluoroalkyl radical;

the glass transition temperature of the copolymer being at least 80° C.,
the maximum mole percentage, $M_a \ldots M_i$, of the comonomer in the copolymers being as follows:
   a) for tetrafluoroethylene, $M_a=70$,
   b) for chlorotrifluoroethylene, $M_b=70$,
   c) for vinylidene fluoride, $M_c=70$,
   d) for hexafluoropropylene, $M_d=15$,
   e) for trifluoroethylene, $M_e=30$,
   f) for $CF_2=CFOR_F$, $M_f=30$,
   g) for $CF_2=CFOQZ$, $M_g=20$,
   h) for vinyl fluoride, $M_h=70$, and
   i) for $R_fCH=CH_2$, $M_i=10$;
and, in the case of copolymers with more than one comonomer, the amount of each comonomer being such that the sum, S, of the ratios of the mole percentages, $m_a \ldots m_i$, to the corresponding maximum mole percentages, $M_a \ldots M_i$ is no larger than 1, as shown below:

$$S = m_a/M_a + m_b/M_b + \ldots + m_i/M_i \leq 1.$$

3. A pellicle according to claim 2 wherein said amorphous fluoropolymer comprises an amorphous copolymer consisting of 30-99 mole % perfluoro-2,2-dimethyl-1,3-dioxole with complementary amounts of tetrafluoroethylene.

4. A pellicle according to claim 3 wherein said amorphous fluoropolymer comprises a copolymer consisting of 60-90 mole % perfluoro-2,2-dimethyl-1,3-dioxole with 40-10 mole % tetrafluoroethylene.

5. A pellicle according to claim 2 wherein said film absorbs less than 6% of incident light in the band of 193 nanometers to 820 nanometers.

6. A pellicle according to claim 5 wherein said film absorbs less than 3% of incident light in the band of 245 nanometers to 820 nanometers.

7. A pellicle according to claim 1, wherein said thin film has a thickness of 0.3 to 20 microns.

* * * * *

(12) REEXAMINATION CERTIFICATE (4535th)
United States Patent
Keys

(10) Number: US 5,061,024 C1
(45) Certificate Issued: Feb. 26, 2002

(54) AMORPHOUS FLUOROPOLYMER PELLICLE FILMS

(75) Inventor: Dalen E. Keys, Towanda, PA (US)

(73) Assignee: DuPont Photomasks, Inc., Round Rock, TX (US)

Reexamination Request:
No. 90/005,181, Dec. 11, 1998

Reexamination Certificate for:
Patent No.: 5,061,024
Issued: Sep. 29, 1991
Appl. No.: 07/403,644
Filed: Sep. 6, 1989

(51) Int. Cl.[7] ................................................ G02B 1/04
(52) U.S. Cl. ....................... 359/350; 359/507; 359/892; 428/14
(58) Field of Search ............................ 359/350, 361, 359/507, 511, 892

(56) References Cited

U.S. PATENT DOCUMENTS

| | | | |
|---|---|---|---|
| 3,626,141 A | 12/1971 | Daly | 219/121 L |
| 3,925,081 A | 12/1975 | Chiklis | 96/72 |
| 4,046,457 A | 9/1977 | Land et al. | 350/164 |
| 4,047,804 A | 9/1977 | Stephens | 350/164 |
| 4,066,814 A | 1/1978 | Chiklis | 428/333 |
| 4,131,363 A | 12/1978 | Shea et al. | 355/75 |
| 4,444,826 A | 4/1984 | Sasaki et al. | 428/216 |
| 4,465,759 A | 8/1984 | Duly et al. | 430/321 |
| 4,657,805 A | 4/1987 | Fukumitsu et al. | 428/215 |
| 4,796,973 A | 1/1989 | Gordon | 350/1.1 |
| 4,933,110 A | 6/1990 | Tucker | 252/582 |
| 4,966,813 A | 10/1990 | Agou et al. | 428/421 |
| 4,970,099 A | 11/1990 | Adams et al. | 428/76 |
| 4,996,106 A | 2/1991 | Nakagawa et al. | 428/343 |
| 5,008,156 A | 4/1991 | Hong | 428/506 |
| 5,009,953 A | 4/1991 | Foster et al. | 428/327 |
| 5,234,780 A | 8/1993 | Nitayama et al. | 450/5 |
| 5,339,197 A | 8/1994 | Yen | 359/359 |
| 5,356,739 A | 10/1994 | Kawasaki et al. | 430/5 |

FOREIGN PATENT DOCUMENTS

| | | | |
|---|---|---|---|
| JP | 63-260932 | 10/1988 | 5/18 |
| JP | 8-22929 | 3/1996 | 5/18 |

OTHER PUBLICATIONS

63-260932

*Primary Examiner*—Darren Schuberg

(57) ABSTRACT

A pellicle comprising a thin, durable film of substantially uniform thickness which absorbs less than 10% light at wavelengths between 190 and 820 nanometers, tautly adhered to one edge of an enclosed support frame, said thin film comprising amorphous fluoropolymers having a refractive index between 1.24 and 1.41. Pellicles of this type are dust defocusing covers for photomasks and reticles used to project patterns onto light sensitive substrates such as photoresist-coated semiconductor wafers which are used in the manufacture of integrated circuits.

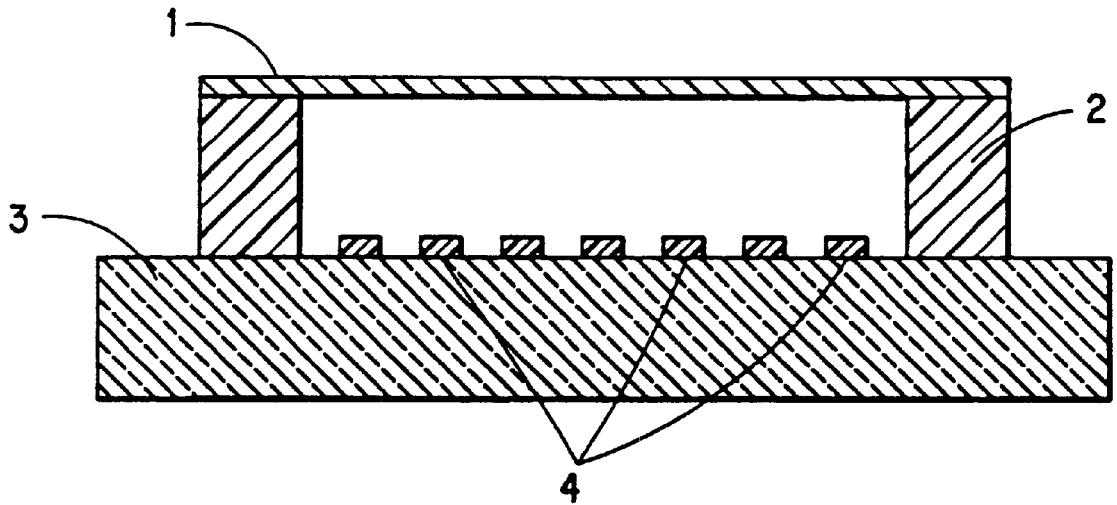

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 2 are determined to be patentable as amended.

Claims 3–7, dependent on an amended claim, are determined to be patentable.

New claims 8–19 are added and determined to be patentable.

1. A pellicle comprising a thin, durable film of substantially uniform thickness which absorbs less than 10% light at wavelengths between 190 and 820 nanometers *and has less than 1% reduction in average transmission from 200 to 300 nanometers after 500 Joules/cm² of total exposure using 248 nanometer wavelength light*, tautly adhered to one edge of an enclosed support frame, said thin film comprising amorphous fluoropolymers having a refractive index between 1.24 and 1.41.

2. A pellicle [according to claim 1] *comprising a thin, durable film of substantially uniform thickness which absorbs less than 10% light at wavelengths between 190 and 820 nanometers, tautly adhered to one edge of an enclosed support frame, said thin film comprising amorphous fluoropolymers having a refractive index between 1.24 and 1.41*, wherein said amorphous fluoropolymers are copolymers of 30–99 mole % of perfluoro-2,2-dimethyl-1,3-dioxole with complementary amounts of at least one comonomer selected from the class consisting of the following compounds:

a) tetrafluoroethylene,
   b) chlorotrifluoroethylene,
   c) vinylidene fluoride,
   d) hexafluoropropylene,
   e) trifluoroethylene,
   f) perfluoro(alkyl vinyl ethers) of the formula $CF_2=CFOR_F$, where $R_F$ is a normal perfluoroalkyl radical having 1–3 carbon atoms,
   g) fluorovinyl ethers of the formula $CF_2=CFOQZ$, where Q is a perfluorinated alkylene radical containing 0–5 ether oxygen atoms, wherein the sum of the C and O atoms in Q is 2 to 10; and Z is a group selected from the class consisting of —COOR, —$SO_2F$, —CN, —COF, and —$OCH_3$, where R is a $C_1$–$C_4$ alkyl,
   h) vinyl fluoride, and
   i) (perfluoroalkyl)ethylene, $R_fCH=CH_2$, where $R_f$ is a $C_1$–$C_8$ normal perfluoroalkyl radical;

the glass transition temperature of the copolymer being at least 80° C.,
   the maximum mole percentage, $M_a \ldots M_i$, of the comonomer in the copolymers being as follows:

a) for tetrafluoroethylene, $M_a=70$,
   b) for chlorotrifluoroethylene, $M_b=70$,
   c) for vinylidene fluoride, $M_c=70$,
   d) for hexafluoropropylene, $M_d=15$,
   e) for trifluoroethylene, $M_e=30$,
   f) for $CF_2=CFOR_F$, $M_f=30$,
   g) for $CF_2=CFOQZ$, $M_g=20$,
   h) for vinyl fluoride, $M_h=70$, and
   i) for $R_fCH=CH_2$, $M_i=10$;

and, in the case of copolymers with more than one comonomer, the amount of each comonomer being such that the sum, S, of the ratios of the mole percentages, $m_a \ldots m_i$, to the corresponding maximum mole percentages, $M_a \ldots M_i$ is no larger than 1, as shown below:

$$S = m_a/M_a + m_b/M_b + \ldots + m_i/M_i \leq 1.$$

*8. A pellicized mask, comprising:*

*a pellicle comprising a thin, durable film of substantially uniform thickness which absorbs less than 10% light at wavelengths between 190 and 820 nanometers and has less than 1% reduction in average transmission from 200 to 300 nanometers after 500 Joules/cm² of total exposure using 248 nanometer wavelength light, tautly adhered to one edge of an enclosed support frame, the thin film comprising amorphous fluoropolymers having a refractive index between 1.24 and 1.41; and*

*a mask having a surface and a pattern formed on the surface, an opposite edge of the enclosed support frame secured to the mask.*

*9. The pellicized mask of claim 8, wherein the thin film has a thickness of 0.3 to 20 microns.*

*10. The pellicized mask of claim 8, wherein the mask is transparent and composed of silica, and the pattern is coated on the surface of the mask.*

*11. The pellicized mask of claim 10, wherein the enclosed support frame encompasses the pattern and the thin film is suspended above the pattern.*

*12. A pellicized mask, comprising: a pellicle comprising a thin, durable film of substantially uniform thickness which absorbs less than 10% light at wavelengths between 190 and 820 nanometers, tautly adhered to one edge of an enclosed support frame, the thin film comprising amorphous fluoropolymers having a refractive index between 1.24 and 1.41, wherein the amorphous fluoropolymers are copolymers of 30–99 mole % of perfluoro-2,2-dimethyl-1,3-dioxole with complementary amounts of at least one comonomer selected from the class consisting of the following compounds:*

*a) tetrafluoroethylene,*
   *b) chlorotrifluoroethylene,*
   *c) vinylidene fluoride,*
   *d) hexafluoropropylene,*
   *e) trifluoroethylene,*
   *f) perfluoro(alkyl vinyl ethers) of the formula $CF_2=CFOR_F$, where $R_F$ is a normal perfluoroalkyl radical having 1–3 carbon atoms,*
   *g) fluorovinyl ethers of the formula $CF_2=CFOQZ$, where Q is a perfluorinated alkylene radical containing 0–5 ether oxygen atoms, wherein the sum of the C and O atoms in Q is 2 to 10; and Z is a group selected from the class consisting of —COOR, —$SO_2F$, —CN, —COF, and —$OCH_3$, where R is a $C_1$–$C_4$ alkyl,*
   *h) vinyl fluoride, and*
   *i) (perfluoroalkyl)ethylene, $R_fCH=CH_2$, where $R_f$ is a $C_1$–$C_8$ normal perfluoroalkyl radical;* the glass transition temperature of the copolymer being at least 80° C.;

the maximum mole percentage, $M_a \ldots M_i$, of the comonomer in the copolymers being as follows:

a) for tetrafluoroethylene, $M_a=70$,
b) for chlorotrifluoroethylene, $M_b=70$,
c) for vinylidene fluoride, $M_c=70$,
d) for hexafluoropropylene, $M_d=15$,
e) for trifluoroethylene, $M_e=30$,
f) for $CF_2\!=\!CFOR_F$, $M_f=30$,
g) for $CF_2\!=\!CFOQZ$, $M_g=20$,
h) for vinyl fluoride, $M_h=70$, and
i) for $R_fCH\!=\!CH_2$, $M_i=10$;

and, in the case of copolymers with more than one comonomer, the amount of each comonomer being such that the sum, S, of the ratios of the mole percentages, $m_a \ldots m_i$, to the corresponding maximum mole percentages, $M_a \ldots m_i$ is no larger than 1, as shown below:

$$S=m_a/M_a+m_b/M_b+ \ldots +m_i/M_i \leq 1; \text{ and}$$

a mask having a surface and a pattern formed on the surface, an opposite edge of the enclosed support frame secured to the mask.

13. The pellicized mask of claim 12, wherein the amorphous fluoropolymer comprises an amorphous copolymer consisting of 30–99 mole % perfluoro-2,2-dimethyl-1,3-dioxole with complementary amounts of tetrafluoroethylene.

14. The pellicized mask of claim 13, wherein the amorphous fluoropolymer comprises a copolymer consisting of 60–90 mole % perfluoro-2,2-dimethyl-1,3-dioxole with 40–10 mole % tetrafluoroethylene.

15. The pellicized mask of claim 12, wherein the film absorbs less than 6% of incident light in the band of 193 nanometers to 820 nanometers.

16. The pellicized mask of claim 15, wherein the film absorbs less than 3% of incident light in the band of 245 nanometers to 820 nanometers.

17. A pellicle comprising a thin, durable film having a thickness that varies by less than two wavelengths of exposure frequency per inch and absorbs less than 10% light at wavelengths between 190 and 820 nanometers, tautly adhered to one edge of an enclosed support frame, said thin film comprising amorphous fluoropolymers having a refractive index between 1.24 and 1.41.

18. The pellicle according to claim 17, wherein said amorphous fluoropolymers are copolymers of 30–99 mole % of perfluoro-2,2-dimethyl-1,3-dioxole with complementary amounts of at least one comonomer selected from the class consisting of the following compounds:

a) tetrafluoroethylene,
b) chlorotrifluoroethylene,
c) vinylidene fluoride,
d) hexafluoropropylene,
e) trifluoroethylene,
f) perfluoro(alkyl vinyl ethers) of the formula $CF_2\!=\!CFOR_F$, where $R_f$ is a normal perfluoroalkyl radical having 1–3 carbon atoms,
g) fluorovinyl ethers of the formula $CF_2\!=\!CFOQZ$, where Q is a perfluorinated alkylene radical containing 0–5 ether oxygen atoms, wherein the sum of the C and O atoms in Q is 2 to 10; and Z is a group selected from the class consisting of $-COOR$, $-SO_2F$, $-CN$, $-COF$, and $-OCH_3$, where R is a $C_1$–$C_4$ alkyl,
h) vinyl fluoride, and
i) (perfluoroalkyl)ethylene, $R_fCH\!=\!CH_2$, where $R_f$ is a $C_1$–$C_8$ normal perfluoroalkyl radical;

the glass transition temperature of the copolymer being at least 80° C.;

the maximum mole percentage, $M_a \ldots M_i$, of the comonomer in the copolymers being as follows:

a) for tetrafluoroethylene, $M_a=70$,
b) for chlorotrifluoroethylene, $M_b=70$,
c) for vinylidene fluoride, $M_c=70$,
d) for hexafluoropropylene, $M_d=15$,
e) for trifluoroethylene, $M_e=30$,
f) for $CF_2\!=\!CFOR_F$, $M_f=30$,
g) for $CF_2\!=\!CFOQZ$, $M_g=20$,
h) for vinyl fluoride, $M_h=70$, and
i) for $R_fCH\!=\!CH_2$, $M_i=10$;

and, in the case of copolymers with more than one comonomer, the amount of each comonomer being such that the sum, S, of the ratios of the mole percentages, $m_a \ldots m_i$, to the corresponding maximum mole percentages, $M_a \ldots M_i$ is no larger than 1, as shown below:

$$S=m_a/M_a+m_b/M_b+ \ldots +m_i/M_i \leq 1.$$

19. The pellicle according to claim 17, wherein said thin film has a thickness of approximately 0.8 to 3 microns.

* * * * *